(12) United States Patent
Robb et al.

(10) Patent No.: US 7,030,447 B2
(45) Date of Patent: Apr. 18, 2006

(54) LOW VOLTAGE TRANSIENT VOLTAGE SUPPRESSOR

(75) Inventors: Francine Y. Robb, Fountain Hills, AZ (US); Jeffrey Pearse, Chandler, AZ (US); David M. Heminger, Mesa, AZ (US); Stephen P. Robb, Fountain Hills, AZ (US)

(73) Assignee: Semiconductor Components Industries, L.L.C., Phoenix, AZ (US)

(*) Notice: Subject to any disclaimer, the term of this patent is extended or adjusted under 35 U.S.C. 154(b) by 294 days.

(21) Appl. No.: 10/620,259

(22) Filed: Jul. 15, 2003

(65) Prior Publication Data

US 2004/0070029 A1    Apr. 15, 2004

Related U.S. Application Data

(63) Continuation-in-part of application No. 09/849,720, filed on May 4, 2001, now Pat. No. 6,633,063.

(51) Int. Cl.
*H01L 23/62* (2006.01)

(52) U.S. Cl. .................. 257/361; 257/360; 257/362
(58) Field of Classification Search ................ 257/360, 257/361, 362
See application file for complete search history.

(56) References Cited

U.S. PATENT DOCUMENTS

| | | | | |
|---|---|---|---|---|
| 5,903,028 A | * | 5/1999 | Quoirin et al. | 257/328 |
| 6,441,437 B1 | * | 8/2002 | Gossner | 257/355 |

* cited by examiner

*Primary Examiner*—Ngân V. Ngô
(74) *Attorney, Agent, or Firm*—Kevin B. Jackson (57) ABSTRACT

A method of providing a Transient Voltage Suppression (TVS) device is described utilizing a Metal Oxide Semiconductor (MOS) structure and an Insulated Gate Bipolar Transistor (IGBT) structure. The MOS based TVS devices offer reduced leakage current with reduced clamp voltages between 0.5 and 5 volts. Trench MOS based TVS device (72) provides an enhanced gain operation, while device (88) provides a top side drain contact. The high gain MOS based TVS devices provide increased control over clamp voltage variation.

16 Claims, 13 Drawing Sheets

LOW VOLTAGE TRANSIENT VOLTAGE SUPPRESSOR

The present application is a continuation-in-part and based on prior U.S. application Ser. No. 09/849,720, filed on May 4, 2001 now U.S. Pat. No. 6,633,063, which is hereby incorporated by reference, and priority thereto for common subject matter is hereby claimed.

BACKGROUND OF THE INVENTION

The present invention relates in general to Transient Voltage Suppression (TVS) devices and, more particularly, to low voltage TVS devices.

Virtually all electronic devices are susceptible to transient perturbations such as electrostatic discharge or electromagnetically coupled interference. The perturbations most often occur at the Input/Output (I/O) interfaces to the electronic devices. Typical examples of I/O interfaces susceptible to the transient perturbations, or signals, are power supply input terminals and data bus terminals to name only a few.

Zener or avalanche diodes, to be referred to as TVS junction diodes, have typically been used to protect the electronic devices from damage caused by the transient voltage signals. TVS junction diodes placed into electronic devices for transient suppression are reverse biased under normal, non-transient conditions. During transient conditions, however, the reverse bias voltage exceeds the reverse breakdown voltage and the TVS junction diode clamps the transient voltage to be equal to the reverse breakdown voltage of the diode, thereby preventing the transient voltage from exceeding the maximum voltage that can be sustained by the electronic device.

Prior art TVS junction diodes perform well for high voltage (>5 volt) applications, but pose specific detrimental characteristics in low voltage (<5 volt) applications. The detrimental characteristics of low voltage TVS junction diodes include high leakage current and high capacitance. Battery operated electronic devices using TVS junction diodes for transient voltage protection are particularly vulnerable to leakage current caused by the TVS junction diode, since the battery provides limited current capability. TVS junction diodes operating in the low (<5V) voltage range typically demonstrate leakage current in the milliamp (mA) range.

Electronic devices today are designed to operate at battery supplied potentials below 5 volts, such as 3 volts and 1.8 volts or even lower. The current requirements of the battery operated circuits are being driven lower as well. TVS junction diode protection devices are no longer acceptable in the lower voltage ranges due to the excessive leakage current properties below 5 volts. Prior art TVS devices, such as a punch-through, 3-layer devices, while achieving low voltage protection at low leakage current, exhibit several undesirable characteristics, such as negative resistance, or snapback, and lack of punch-through voltage control. Consequently, the punch-through voltage obtained from device to device is randomly distributed.

Hence, there is a need for a TVS device capable of operation in the sub-5 volt range, with no snapback, acceptable leakage current and low capacitance, having tight control over the clamping voltage.

DETAILED DESCRIPTION OF THE DRAWINGS

Figure 1:
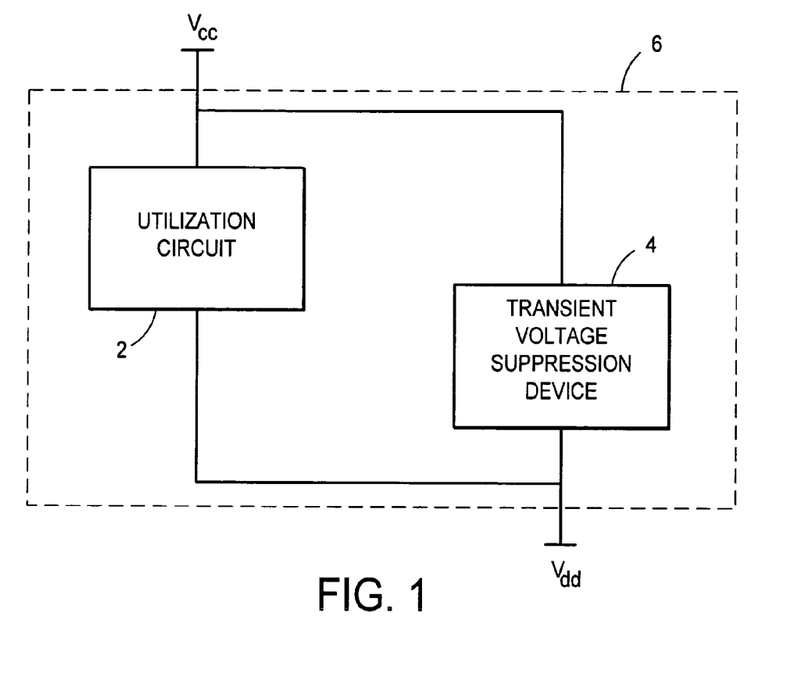
FIG. 1 is an application diagram illustrating a TVS device.

In FIG. 1, an application of TVS device 4 is illustrated whereby TVS device 4 isolates utilization circuit 2 from voltage transients present on power supply terminals $V_{cc}$ and $V_{dd}$. TVS device 4 is effective to suppress both negative and positive transient potentials across utilization circuit 2. It should be noted, that various other applications exist for TVS device 4, such as a protection device used for I/O data lines and various other interfaces. Block 6 may denote an integrated circuit, for example, whereby utilization circuit 2 and TVS device 4 coexist on the same die. Conversely, block 6 may denote a printed circuit board, for example, whereby TVS device 4 is a discrete component providing protection to utilization circuit 2.

Figure 2:
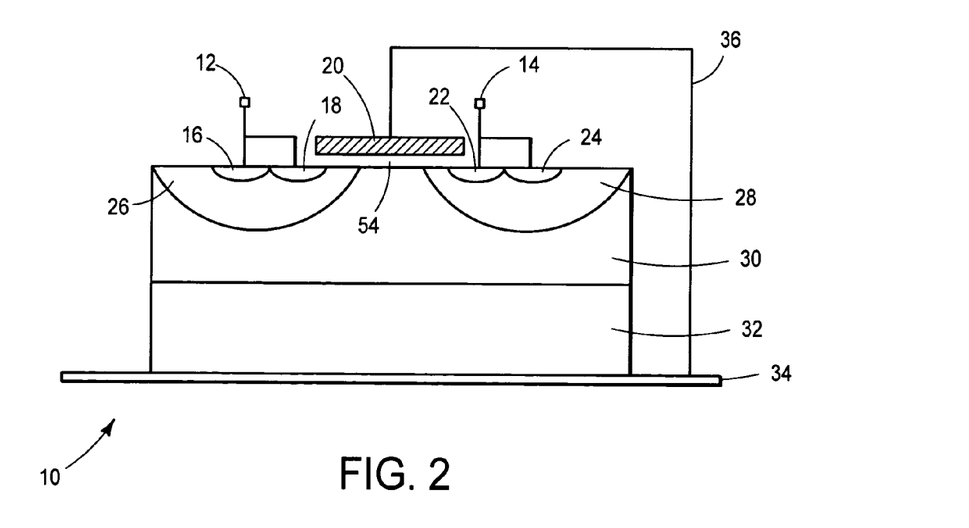
FIG. 2 is a diagram illustrating a Metal Oxide Semiconductor (MOS) device used as a low voltage, TVS device.

Turning to FIG. 2, a vertical MOS device 10 is illustrated, having source terminals 12 and 14, gate terminal 20 and drain terminal 34. Drain terminal 34 is the header of the package encapsulating TVS device 10. Regions 18 and 22 are N+ doped regions and regions 16 and 24 are P+ doped regions. Regions 26 and 28 form P− doped well regions. Region 30 is a N− drift region and region 32 is a N+ region. An advantage of the structure of TVS device 10 is the gate to drain connection 36. Connection 36 provides that the drain voltage $V_d$ and the gate voltage $V_g$ are equivalent and is typically connected to the I/O pin requiring protection, such as a supply terminal or a data terminal. It should be noted that the device illustrated in FIG. 2 is very similar to an Insulated Gate Bipolar Transistor (IGBT), where the drain terminal is replaced by a collector terminal of the IGBT and region 32 is doped P+ instead of N+. Connection 36 can be an external connection used for discrete MOS or IGBT packages or can be integrated into the device during the manufacturing stage of the device.

Figure 3:
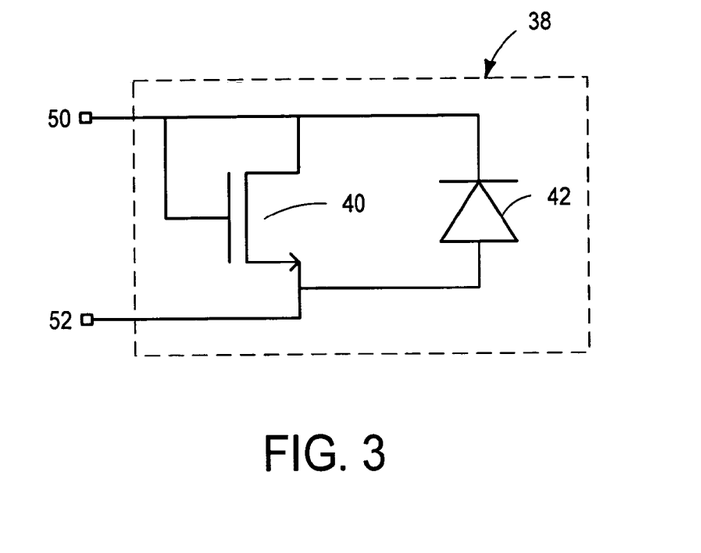
FIG. 3 is a schematic diagram illustrating the equivalent circuit of the voltage suppression device of FIG. 2.

Turning to FIG. 3, an equivalent circuit 38 of the TVS device of FIG. 2 is illustrated. N-type MOS (NMOS) device 40 is shown to be connected in parallel with diode 42, such that the drain terminal of transistor 40 is coupled to the gate terminal of transistor 40 and the cathode terminal of diode 42. The anode of diode 42 is coupled to the source terminal of transistor 40 at ground potential, for example. Diode 42 is an intrinsic diode created within MOS device 40 by the P-N interface between regions 28 and 30 and between regions 26 and 30. Terminals 50 and 52 are considered to be the cathode and anode connections, respectively, of TVS device 38. Using terminals 50 and 52 as the cathode and anode conductors of a two-terminal TVS device, TVS device 38 is used as a drop in replacement for most TVS junction diode applications.

Figure 4:
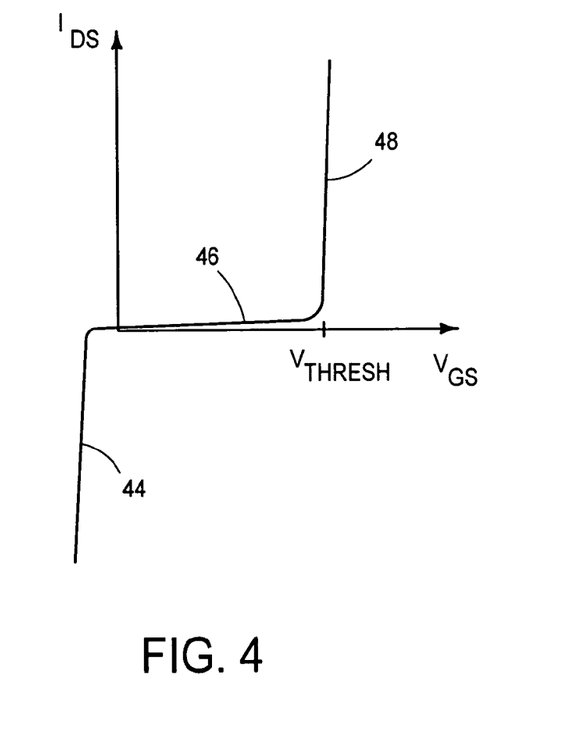
FIG. 4 is a threshold curve useful in explaining the operation of the TVS device of FIG. 2.

The anode of diode 42 is coupled to ground potential, for example, at the source terminal of transistor 40. A negative potential, exceeding the barrier potential of diode 42, applied at the drain terminal of transistor 40 and the cathode terminal of diode 42, causes diode 42 to become forward biased. FIG. 4 illustrates conductive region 44 of intrinsic diode 42. Once the potential across diode 42 has exceeded the barrier potential of diode 42, negative drain to source current is conducted by diode 42, substantially limiting the potential drop across diode 42 to the barrier potential. As the negative drain to source current increases through diode 42, however, the voltage drop across diode 42 increases slightly as shown in region 44.

Region 46 of FIG. 4 denotes a region where NMOS transistor 40 and diode 42 are substantially non-conductive. As the gate to source voltage, $V_{gs}$, of NMOS transistor 40 increases toward the threshold voltage, $V_{thresh}$, a small amount of current conducts from the drain terminal of transistor 40 to the source terminal of transistor 40. The small amount of current conducted by TVS device 38 in region 46 is known as the sub-threshold leakage current. Minimization of the amount of leakage current conducted in region 46 is desired to reduce power consumption of TVS device 38. The amount of leakage current conducted by either MOS or IGBT based TVS device 38 is typically in the nanoamp (nA) range, while the amount of leakage current conducted by a sub-5V TVS junction diode is typically in the milliamp (mA) range. The substantial decrease in the amount of power consumed by TVS device 38, therefore, is a distinct advantage over the use of standard, TVS junction diode based transient voltage suppressors.

Region 48 of FIG. 4 defines the forward conductive region of TVS device 38. Once the voltage at the gate and drain terminals of transistor 40 exceeds the threshold voltage of transistor 40, transistor 40 becomes conductive, substantially maintaining a constant gate to source voltage, or clamp voltage. Since the threshold voltage of the MOS or IGBT based TVS device is readily varied between approximately 0.5 volts and 5.0 volts using implantation adjustments, the clamp voltage is easily adjusted. MOS or IGBT based TVS devices provide operation in the sub-5 volt region with low leakage current capability. The slope of the curve in region 48 is increased to near vertical through increasing the gain of the MOS or IGBT device.

A further advantage of using MOS or IGBT based TVS devices include protection of the gate oxide from voltage transients through the use of the intrinsic diode 42. As can be seen in FIG. 4, region 44 is a limitation of the negative excursion of the gate to source voltage by body diode 42. Body diode 42 also protects the gate oxide from rupture with positive gate-source over-voltages, depending on the breakdown voltage of diode 42. Another advantage exhibited by the MOS or IGBT based TVS device is the low series resistance and low capacitance, which is controlled by the doping of region 30. A further advantage is the gain control of TVS device 38, through the proper selection of the thickness of gate oxide layer 54 and the channel packing density.

Figure 5:
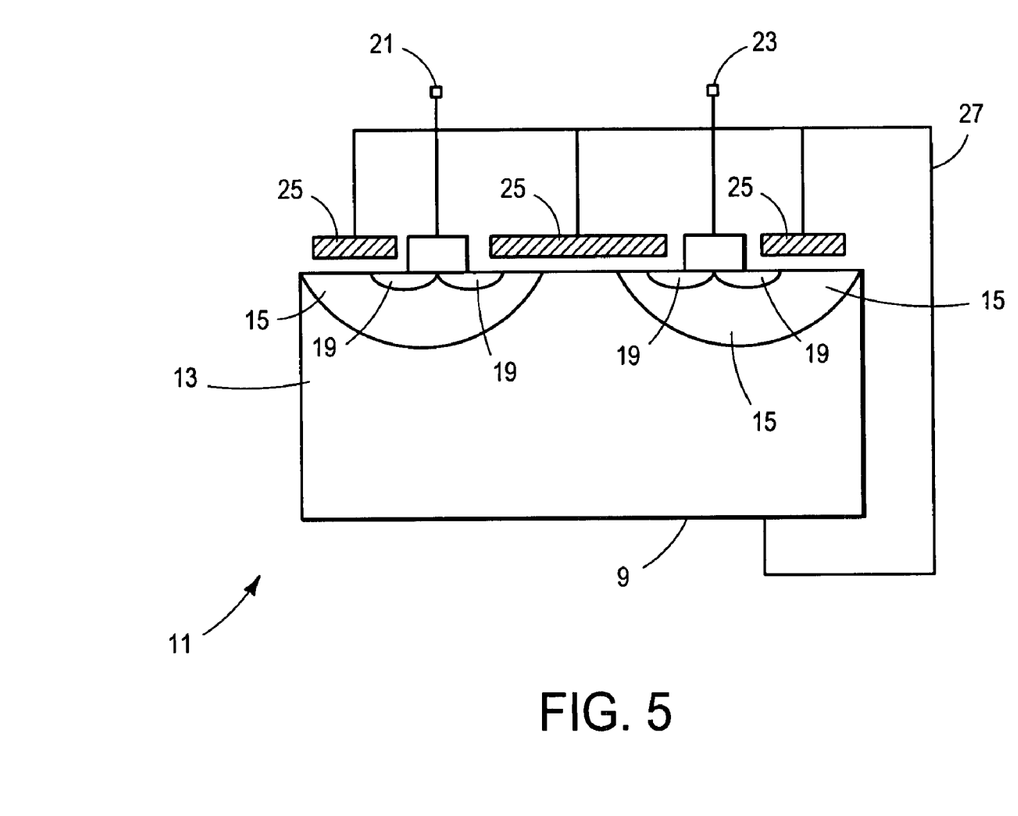
FIG. 5 is a diagram illustrating a MOS device used as a symmetrical, clipping TVS device.

FIG. 5 illustrates a vertical MOS clipping device 11 having multiple gate electrodes 25 interconnected using conductor 27 and having a common connection to drain 9. Source electrodes 21 and 23 provide the external connections to TVS device 11. Source regions 19 are N$^+$ doped and are formed inside P-well regions 15. Region 13 is an N doped region.

Figure 6:
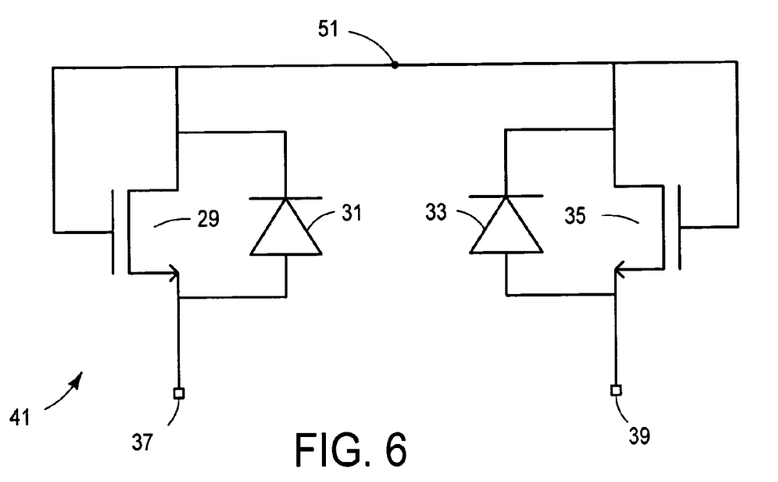
FIG. 6 is a schematic diagram illustrating the equivalent circuit of the symmetrical, clipping TVS device of FIG. 5.

Turning to FIG. 6, an equivalent circuit 41 of the TVS device of FIG. 5 is illustrated. N-type MOS (NMOS) device 29 is shown to be connected in parallel with diode 31, such that the drain terminal of transistor 29 is coupled to the gate terminal of transistor 29 and the cathode terminal of diode 31. The anode of diode 31 is coupled to the source terminal of transistor 29. Additionally, NMOS device 35 is shown to be connected in parallel with diode 33, such that the drain terminal of transistor 35 is coupled to the gate terminal of transistor 35 and the cathode terminal of diode 33. The anode of diode 33 is coupled to the source terminal of transistor 35. Diodes 31 and 33 are intrinsic diodes created within MOS devices 29 and 35 by the P-N interface between regions 15 and 13. Terminals 21 and 23 are the external connections of TVS device 11. The gate terminals of transistors 29 and 35 are coupled together at the cathode terminals of diodes 31 and 33.

Figure 7:
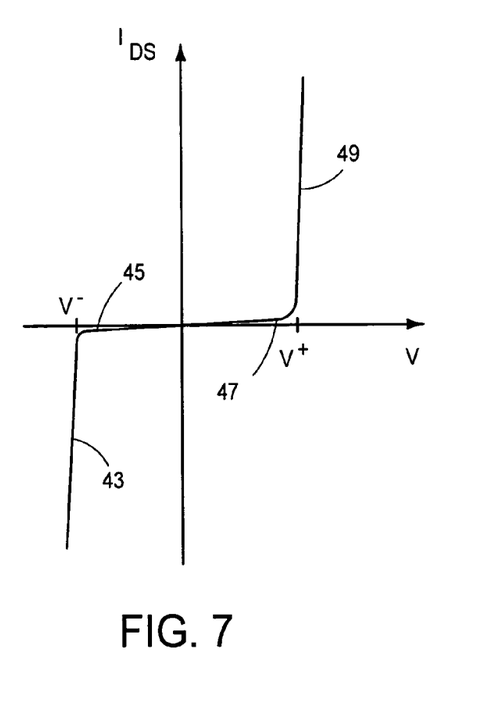
FIG. 7 is a threshold curve useful in explaining the operation of the symmetrical TVS device of FIG. 5.

FIG. 7, in combination with FIG. 6, illustrates the operation of TVS device 41. A positive voltage, $V_{37}$, is applied at terminal 37 with respect to terminal 39. Diode 31 is forward biased and places a potential, $V_{51}$, at node 51, where $V_{51}$ is defined by the following equation, $V_{51}=V_{37}-V_{31}$, where $V_{31}$ is the barrier potential of diode 31. When $V_{51}$ increases above the threshold voltage of transistor 35, transistor 35 becomes conductive and creates a current path from terminal 37, through diode 31, through transistor 35 to terminal 39. Transistor 29 remains non-conductive, since the source voltage of transistor 29 exceeds the gate voltage of transistor 29. The voltage at terminal 37, therefore, is clamped to the threshold voltage of transistor 35 added to the barrier potential of diode 31, indicated as V$^+$ in FIG. 7. Conversely, a positive voltage, $V_{39}$, is applied at terminal 39 with respect to terminal 37. Diode 33 is forward biased and places a potential, $V_{51}$, at node 51, where $V_{51}$ is defined by the following equation, $V_{51}=V_{39}-V_{33}$, where $V_{33}$ is the barrier potential of diode 33. When $V_{51}$ increases above the threshold voltage of transistor 29, transistor 29 becomes conductive and creates a current path from terminal 39, through diode 33, through transistor 29 to terminal 37. Transistor 35 remains non-conductive, since the source voltage of transistor 35 exceeds the gate voltage of transistor 35. The voltage at terminal 39, therefore, is clamped to the threshold voltage of transistor 29 added to the barrier potential of diode 33, indicated as V$^-$ in FIG. 7. Regions 45 and 47 denote regions where NMOS transistor 29, diode 31, NMOS transistor 35 and diode 33 are substantially non-conductive. The TVS device of FIG. 6, therefore, provides a circuit which suppresses both positive and negative excursions of transient potentials applied across terminals 37 and 39 in a symmetrical manner.

Figure 8:
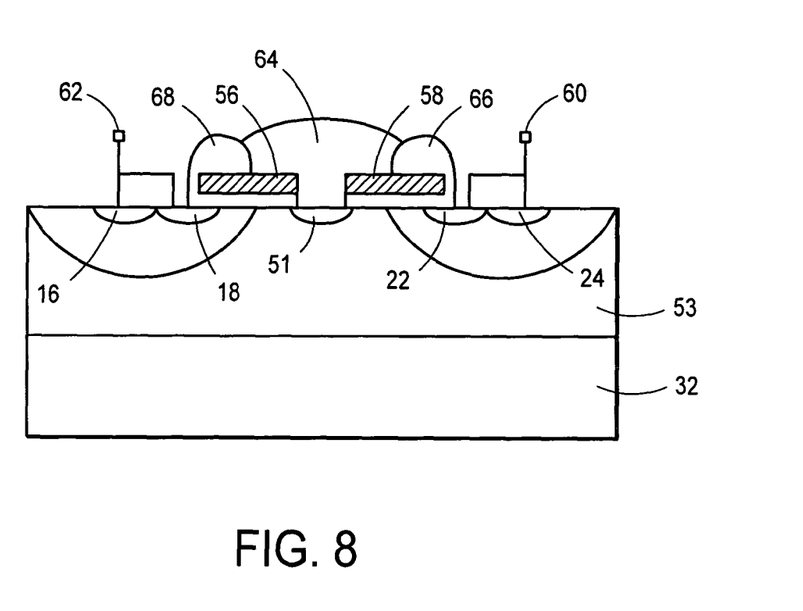
FIG. 8 illustrates a MOS device with an integral gate-drain connection used as a TVS device.

FIG. 8 illustrates an alternate TVS device utilizing a split gate MOS structure and an integral gate-drain connection. The device of FIG. 8 demonstrates the capability of providing on-chip gate to drain connections, obviating the need for a connection strap between the gate to drain terminal as shown in FIG. 2. Split gate terminals 56 and 58 overlap source regions 18 and 22. Metal layer 64 provides contact to gate terminals 56 and 58, while insulating layers 68 and 66 provide the required electrical isolation between gate and source terminals. $N^+$ region 51 provides the integrated contact to $N^-$ drift region 53 to complete the gate to drain connection.

Figure 9:
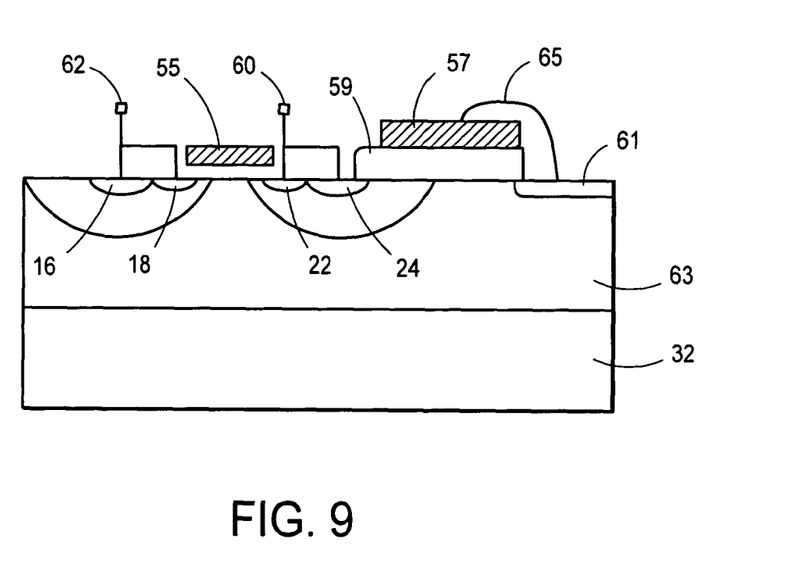
FIG. 9 illustrates an alternate MOS device with an integral gate-drain connection used as a TVS device.

FIG. 9 illustrates an alternate TVS device using gate feed 57 and metal strap 65 to provide an electrical contact to $N^+$ region 61. Scribe grid 63 is an N doped region making contact with $N^+$ substrate 32 to complete the gate to drain connection.

Figure 10:
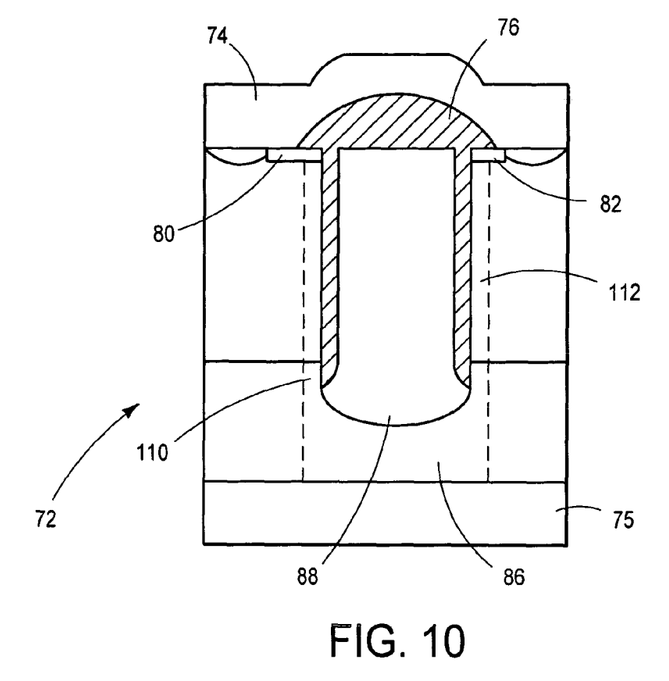
FIG. 10 illustrates a trench MOS device used as a TVS device.

FIG. 10 illustrates a trench TVS device 72 having trench gate 88 providing a built in connection to N- drift region 86, which forms the drain region. Trench gate 88 is formed using polysilicon. $N^+$ source regions 80 and 82 are in electrical contact to source metal layer 74. Oxide layer 76 is formed, which provides the proper isolation between polysilicon gate 88 and source regions 80 and 82. An anisotropic spacer etch is used to provide the built in connection between gate 88 and drain region 86. $N^+$ drain contact region 75 provides the drain contact to device 72. It should be noted that TVS device 72 is easily converted into an IGBT device having emitter regions 80 and 82 by making drain contact region into a P+ doped collector region. Once TVS device 72 becomes conductive, due to the voltage applied across the gate and source terminals of TVS device 72 exceeding the threshold voltage of TVS divice 72, conduction channels 110 and 112 form along the vertical sidewalls of gate 88. Once current begins to flow through TVS device 72, the gate source voltage of TVS device 72 is held substantially equal to $V_{thresh}$ as shown in region 48 of FIG. 4. The gain of TVS device 72 can be increased due to the higher packing density of channels 110 and 112 in the trench configuration. As stated earlier, higher gain values of the TVS device tends to increase the slope of the voltage curve in region 48 of FIG. 4 to approach near vertical slope, providing greater control over the clamping voltage.

Figure 11:
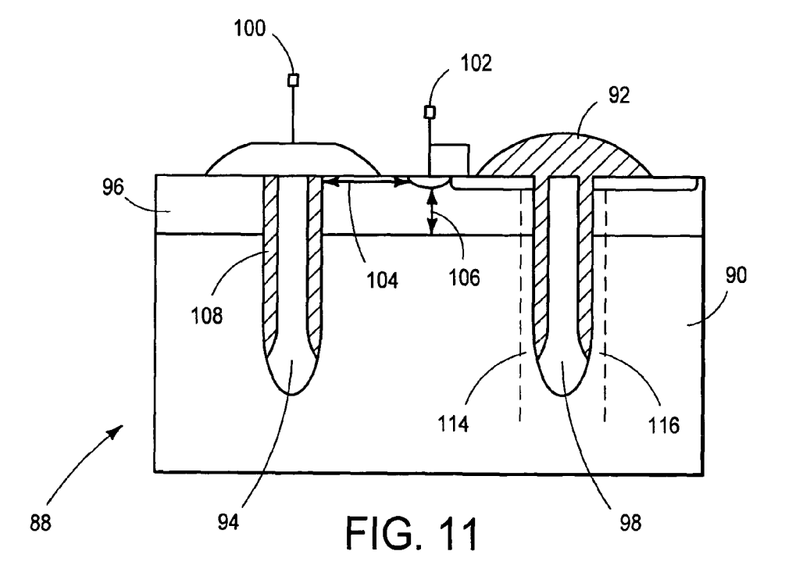
FIG. 11 illustrates a modified trench MOS device with topside drain contact.

FIG. 11 illustrates a trench TVS device 88, which utilizes trench gate 98 to make contact with $N^+$ buried layer or substrate 90, which ultimately creates the contact to drain plug 94. Source contact 102 and drain contact 100 provide the electrical interconnects to TVS device 88, while the gate to drain connection is inherent within the structure of TVS device 88, specified above. Conduction channels 114 and 116 form along gate 98 when the gate to source voltage applied to TVS device 88 exceeds the threshold voltage of TVS device 88. Distance 104 is held to be greater than distance 106 in order to ensure that breakdown occurs along the vertical path defined by channels 114 and 116, instead of the horizontal path defined by 104. Proper conduction during a transient event occurs along conduction channels 114 and 116n horizontally across $N^-$ buried layer 90 and up through drain plug 94. The gain exhibited by TVS device 88 is high, which results in near vertical breakdown voltage slope in region 48 of FIG. 4.

Figure 12:
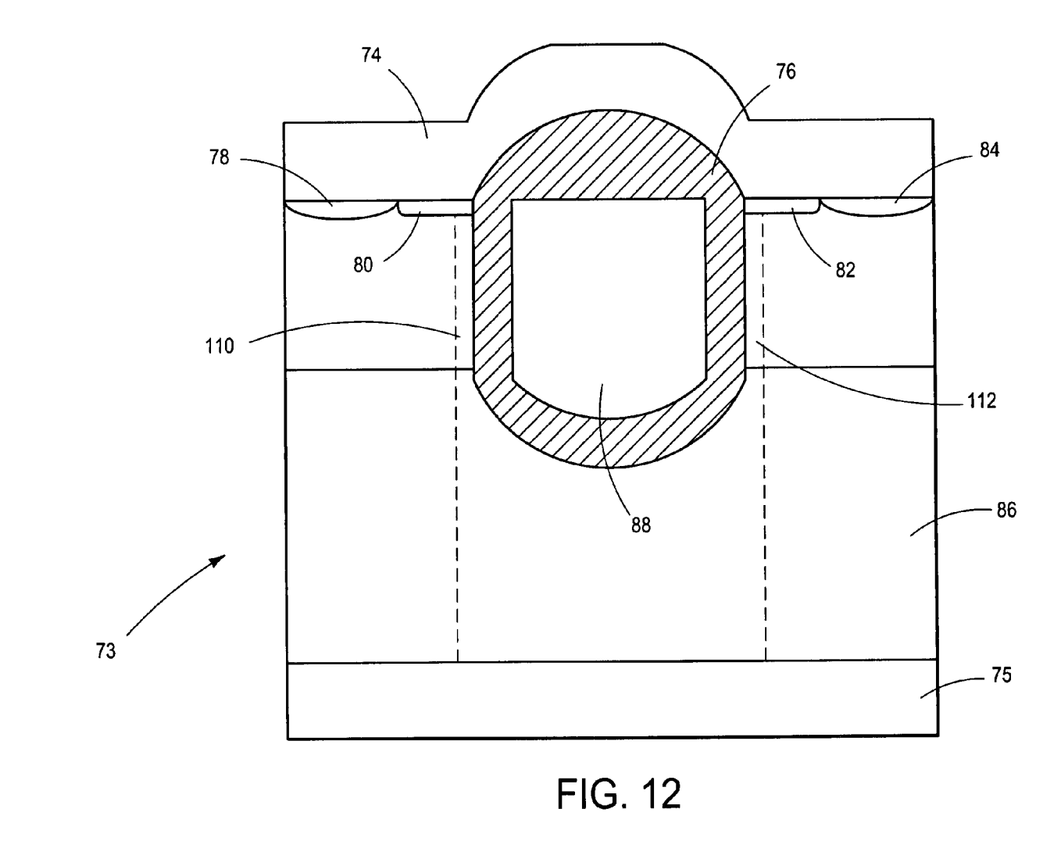
FIG. 12 illustrates an alternate trench device used as a TVS device.

FIG. 12 illustrates TVS device 73, which is similar to TVS device 72, illustrated in FIG. 10, except that the gate region does not directly contact the $N^-$ drift region 86. Contact between drain region 75 and gate region 88 is achieved externally or at the edge terminations of TVS device 73. It should be noted that TVS device 73, having $N^+$ emitter regions, is easily converted into an IGBT device by replacing $N^+$ drain egion 75 by a $P^+$ collector region.

Figure 13:
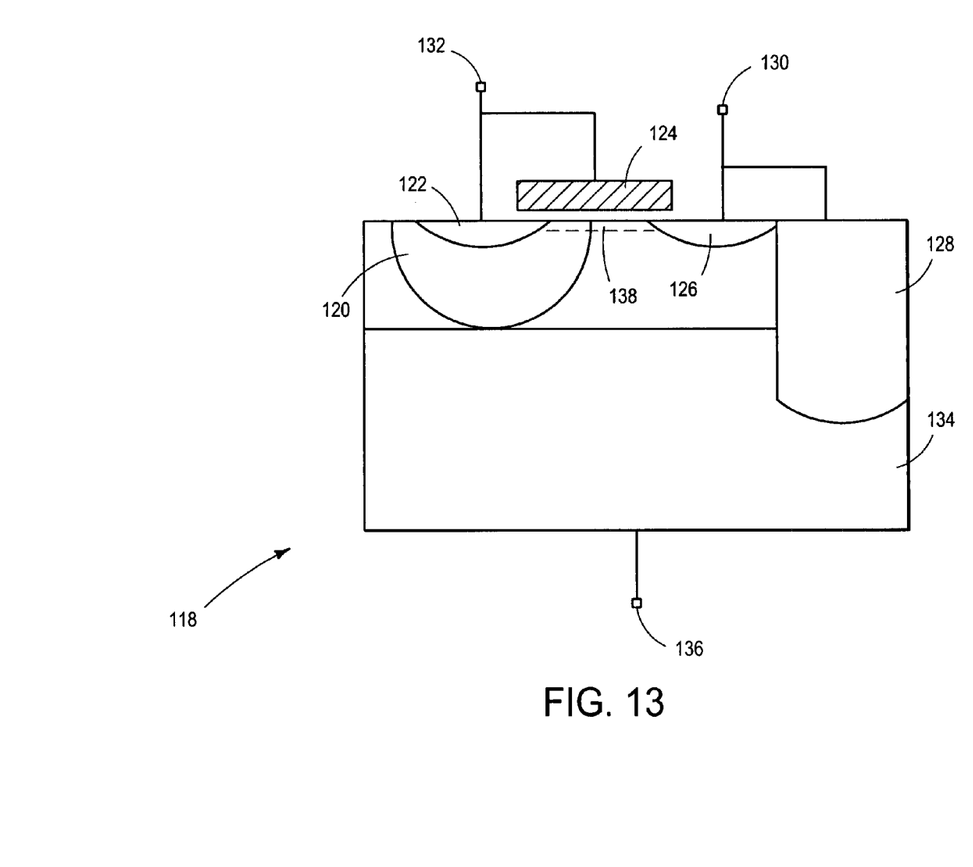
FIG. 13 illustrates a lateral MOS device used as a TVS device.

FIG. 13 illustrates lateral TVS device 118 having source contacts 130 and 136 and an electrical connection 132 between drain 122 and gate 124. Drain and source regions, 122 and 126 respectively, are $N^+$ doped regions. Region 120 is an $N^-$ doped region, forming a built-in punchthrough diode with $P^+$ ubstrate 134. The punchthrough diode provides an additional current path for handing high surge currents. $P^+$ sinker region 128 provides a topside substrate contact.

Figure 14:
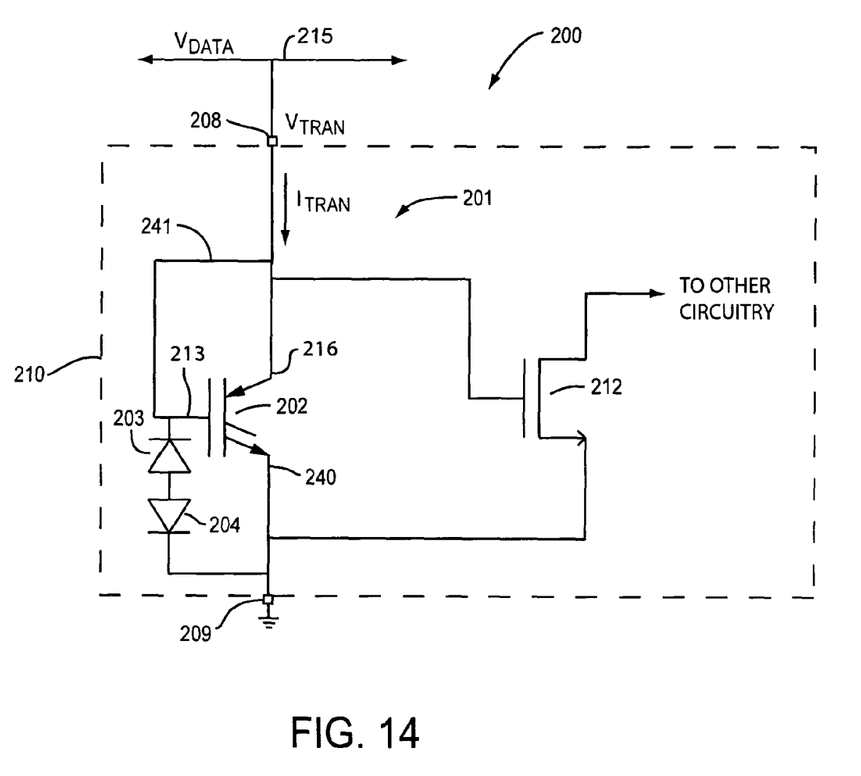
FIG. 14 is a schematic diagram of an integrated circuit including an insulated gate bipolar transistor (IGBT)-based TVS device.

FIG. 14 shows a schematic diagram of an integrated circuit 200 including an IGBT-based GVS device 201 housed in a semiconductor package 210 having a lead 208 coupled to an external bus 215 carries an information signal $V_{DATA}$ that operates between zero and two volts, and is susceptible to a high energy, high voltage transient signal $V_{TRANS}$ that is induced by electrostatic dischrge or a line disturbance and effectively superposed on information signal $V_{DATA}$.

TVS device 201 includes an IGBT 202 and back-to-back diodes 203–204. IGBT 202 is coupled across leads 208–209 of semiconductor package 210 to dissipate the energy induced by $V_{TRANS}$ by turning on when $V_{TRANS}$ is greater than a predefined level. Energy is dissipated by shunting an associated surge current $I_{TRANS}$ when $V_{TRANS}$ reaches ghe predefined level typically set by adjusting the gate-emitter conduction threshold of IGBT 202 during fabrication by varying the dopand level ghag i implanted in the channel region to adjust the conduction hreshold of the device.

Integrated circuit 200 may include an input transistor 212 whose source and gate electrodes are coupled to leades 208–209, respectively, for coupling $V_{DATA}$ to other circuitry of integrated circuit 200. Its gate electrode is coupled to lead 208 and formed to operate at an amplitude less than its gate rupture potential which, in one embodiment, is about twenty volts. TVS device 201 protects the gate oxide of transistor 212 from being ruptured by an excessive electric field by clamping $V_{TRANS}$ to limit its voltage magnitude. Alternatively, TVS device 201 could be formed as a two-lead stand alone integrated circuit that suppresses transient signals on external data and/or power supply lines to protect external circuitry.

IGBT 202 may be either a vertical or planar device that is configured to present leads 208–209 with a low capacitance. Doping levels are selected so that IGBT 202 has a gate-emitter conduction threshold of about 2.3 volts and a low subthreshold collector-emitter leakage current. A gate terminal 213 is connected with an inerconnect line 241 to a collector terminal and to lead 208, while an interconnect line 240 operates as an emitter terminal connected to lead 209, which operates at ground potential. The gate connection results in IGBT 202 turning on when the voltage on lead 208 is greater than about 2.3 volts. Consequently, when lead 208 operates between zero and two volts, i.e., within the $V_{DATA}$ range, TVS device 201 operates as a substantially open circuit, while turning on to shunt current when its gate voltage exceeds about 2.3 volts to effectively clamp lead 208 to a voltage level less than about five volts.

Diodes 203–204 are formed on the same die as IGBT 202 and configured to protect the IGBT 202 gate from destructively breaking down when $V_{TRANS}$ undergoes a negative transition. When $V_{TRANS}$ is negative, diode 203 is forward biased while diode 204 is reverse biased. Diodes 203–204 are doped to breakdown at a voltage in a range between six and seven volts. Depending on the gate oxide breakdown or rupture voltage in a particular application, virtually any number of series-connected back-to-back diode can be formed between the emitter and gate terminals of IGBT 202 to set the protection voltage to a value less than the rupture voltage. For example, in an embodiment where the gate oxide rupture voltage is twenty volts, two pairs of serially connected back-to-back diodes can be used to maintain the gate voltage less than twelve volts.

To see the operation of TVS device 201, assume that input transistor 212 has a destructive gate to source breakdown or gate oxide rupture of five volts and that IBGT 202 is doped to have a conduction threshold $V_{TH}$=2.3 volts.

Since IGBT 202 has a low capacitance as well as a higher conduction threshold than the amplitude of $V_{DATA}$, under normal conditions, TVS device 201 effectively operates as an open circuit with respect to leads 208–209. Now asume that electrostatic discharge or other system even induces a five ampere transient signal $V_{TRANS}$ on bus 215 at a voltage level greater than $V_{TH}$=2.3 volts. TVS device 201 turns on to shunt a transient current $I_{TRANS}$ generated by $V_{TRANS}$, thereby dissipating the transient energy and clamping the voltage at the gate of transistor 212 to a value less than five volts. $I_{TRANS}$ causes internal regions of IGBT 202 to be conductivity modulated, which results in a low on-state resistance and low voltage drop. For example, in an embodiment in which IGBT 202 has an effective active area of about 0.7 millimeters$^2$, TVS device 201 can clamp lead 208 to a voltage level of less than about five volts while shunting five amperes of peak $I_{TRANS}$ current. Consequently, the gate of input transistor 212 is maintained below its destructive rupture value, which avoids permanent damage to transistor 212 and increases the reliability of integrated circuit 200.

Figure 15:
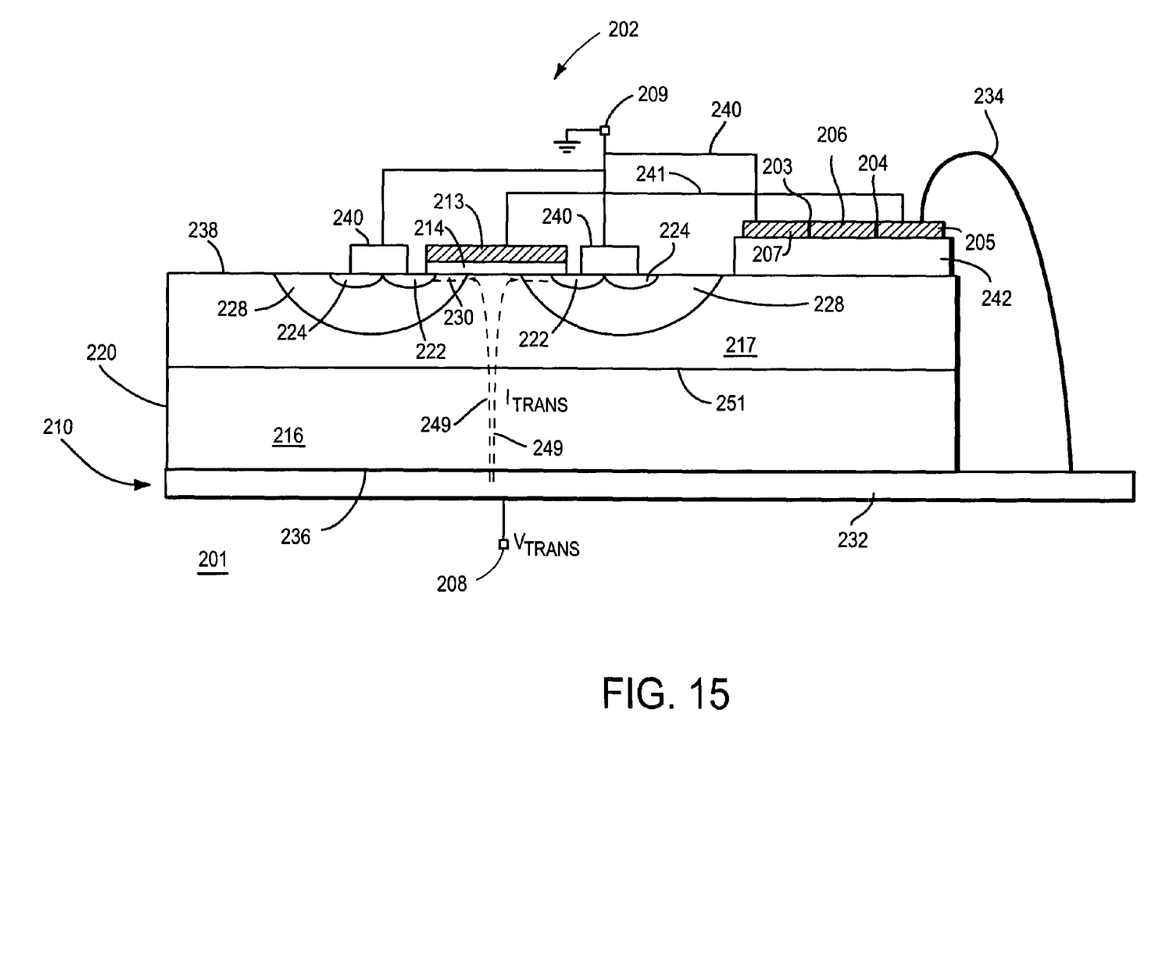
FIG. 15 is a cross-sectional view of the IGBT-based TVS device.

FIG. 15 is a cross-sectional view of integrated circuit 200 including IGBT 202 and diodes 203–204 of TVS device 201 as formed on a semiconductor substrate 220. In one embodiment, IGBT 202 is implemented as an n-channel device.

A sublayer 216 is formed at a bottom surface 236 of substrate 220 and heavily doped to have a p-type conductivity to operate as low-resistance collector terminal of IGBT 202. The heavy doping levels also ensure that a uniform, high quality ohmic contact can be made to bottom surface 236. In one embodiment, sublayer 216 is made of monocrystalline silicon.

An epitaxial layer 217 is formed over sublayer 216 to operate as a drift region of IGBT 202. Epitaxial layer 217 is lightly doped to have an n-type conductivity so that its metallurgical junction wih sublayer 216 has a low capacitance in order to present a minimal reactive load so that TVS device 201 operates as substantially an open circuit when IGBT 202 is turned off. In one embodiment, epitaxial layer 217 is formed to a thickness of about twelve micrometers and a doping concentration of about $10^{14}$ atoms/cemtimeter$^3$.

A body region 228 is formed by diffusing p-type impurities into epitaxial layer 217 through a top surface 236 of semiconductor substrate 220. In one embodiment, body region 228 has a depth of about two micrometers. In the plane of FIG. 15, integrated circuit 200 is shown as having two body regions 228. However, these regions are electrically coupled toether out of the view plane so as to effectively comprise a single body region 228.

A body contact region 224 is formed in body region 228 to provide an ohmic contact at top surface 238. Accordingly, body contact region 224 is heavily doped to have a p-type conductivity and is formed to a depth of, for example, 0,.6 micrometers.

An emitter region 222 is formed at top surface 238 within body region 228. In one embodiment, emitter region 222 is heavily doped wih an n-type conductivity and a depth of about 0.15 micrometers.

A dielectric material is formed over surface 238 to provide a gate dielectric 214 of IGBT 202. In one embodiment, gate dielectric 214 comprises thermally grown silicon dioxide formed to a thickness of about two hundred fifty angstroms.

A conductive material is deposited over surface 238 and patterned to form a gate terminal 213 of IGBT 202 over gate dielectric region 214. In one embodimen, gate terminal 213 is formed with doped polycrystalline silicon to function with gate dielectric 214 as a gate structure of IGBT 202.

The conductive material is further patterned to form cathode regions 205 and 207 and a common anode region 206 over a dielectric region 242. Cathod regions 205 and 207 are doped to have an n-type conductivity and common anode region 206 is doped to have a p-type conductivity. Back to back diodes 203 and 204 result from the metallurgical junctions of common anode region 206 with cathode region 205 and cathod region 207, respectively, as shown. Diodes 203–204 are doped to break down in a range between about six and about seven volts to prevent damage to gate dielectric 214 during a negative-going $V_{TRANS}$ voltage spike. To additional series-coupled back-to-back diodes are typically added to increase the protection voltage to a range between about twelve volts and about fourteen volts.

A metal layer is deposited and patterned to form interconnect line 240 that operates as an emitter terminal. Interconnect line 240 is connected to emitter region 222, to body contact region 224 and to anode region 207 of diode 203. The metal layer is further patterned to produce interconnect line 241 to connect gate terminal 213 to anode 205 of diode 204 as shown.

Semiconductor substrate 220 is mounted on a die flag 232 of semiconductor package 210 with a die attach material that has a low electrical and thermal resistance. In one embodiment, die flag 232 is formed with a low resistance metal such as copper. In one embodiment, die flag 232 operates as lead 208 to provide a low resistance external connection to integrated circuit 200. External connections to lead 209 are made with a standard wire bond or clip lead arrangement.

A bonding wire 234 connects anode 205 of diode 204 to die flag 232 so that gate terminal 213 and collector region or terminal 216 operate at substantially the same potential.

In operation, a positive excursion of transient signal $V_{TRANS}$ is coupled hrough die flag 232, bonding wire 234 and inerconnect line 241 to gate terminal 213. If the amplitude of $V_{TRANS}$ is greater than the conduction threshold of IGBT 202, body region 228 inverts under gate terminal 213 to form a channel 230 that allows surge current $I_{TRANS}$ to flow through IGBT 202 along a current path 249 as shown. IGBT 202 is referred to as a vertical transistor because $I_{TRANS}$ flows vertically through the device betwen top surface 238 and bottom surface 236.

Surge current $I_{TRANS}$ causes a junction 251 between sublayer 216 and epitaxial layer 217 to forward bias, injecting minority carriers conductivity modulate epitaxial layer 217, so that its resistivity is reduced, which reduces the on-state resistance of IGBT 202. Because epitaxial layer 217 is lightly doped to provide a low junction 251 capacitance, the conductivity modulation of can result in an effective resistivity reduction of several orders of magnitude at high $I_{TRANS}$ current levels. For example, at a peak $I_{TRANS}$ current of one hundred amperes, the effective resistance of epitaxial layer 217 an be reduced by as much as a factor of three. As a result, IGBT 202 has a high gain, so large $I_{TRANS}$ current levels are accommodated with only a small increase in potential on lead 208. In effect, $I_{TRANS}$ is shunted to ground potential to dissipate the energy stored in $V_{TRANS}$, thereby clamping the voltage on lead 208 to a level that avoids damaging other components of integrated circuit 200. For negative $V_{TRANS}$ excursions, back-to-back diodes 203–204 break down to clamp the potential on gate terminal 213 to prevent gate rupture or other damage to gate dielectric region 214.

Figure 16:
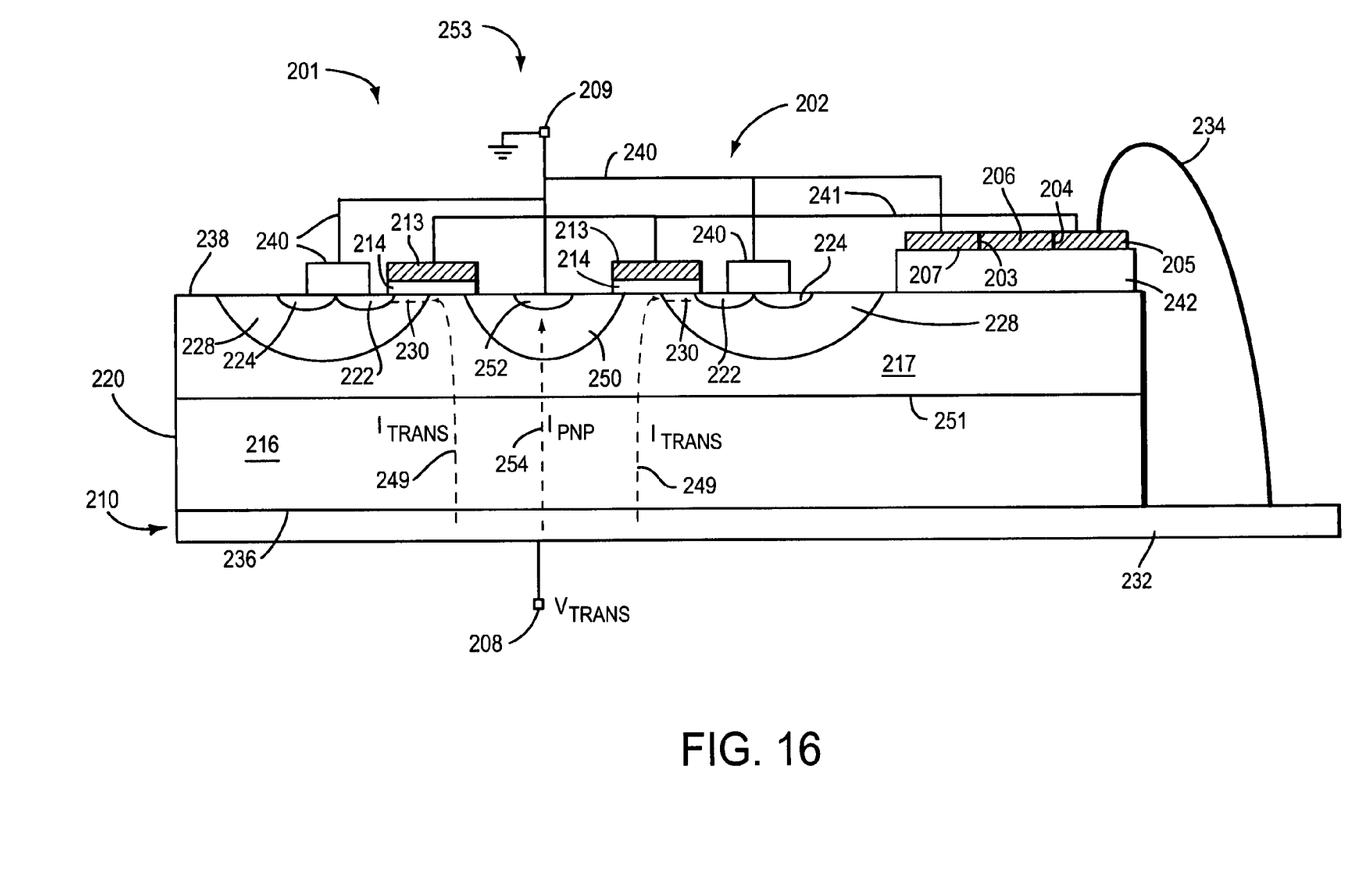
FIG. 16 is a cross-sectional view of the IGBT-based TVS device in an alternate embodiment.

FIG. 16 is a cross-sectional view of TVS device 201 in an alternate embodiment. The structure and operation of this embodiment are similar to what is described above, except that a collection region 250 is formed between portions of body region 228 as shown. Collection region 250 typically is formed using the same processing steps as body region 228, and consequently has a p-type conductivity and similar junction depth and doping concentration. A p-type collection contact region 252 is formed within collection region 250 at top surface 238. Region 252 is heavily doped and typically formed during the same processing steps used to form region 224 to ensure a high quality ohmic contact to collection region 250.

Sublayer 216, epitaxial layer 217 and collection region 250 operate as an emitter, base and collector, respectively, of a merged PNP bipolar transistor 253 that provides a current path 254 between leads 208–209 that is parallel to current path 249 of IGBT 202. When IGBT 202 turns on, surge current $I_{TRANS}$ forward biases junction 251, causing minority carrier holes to be injected into epitaxial layer 217. The holes are collected by collection region 250 as a $V_{TRANS}$ component current $I_{PNP}$ that is summed with $I_{TRANS}$ and routed through leads 208–209 to increase the transconductance gain and overall current capability of TVS device 201, thereby improving both performance and reliability.

Figure 17:
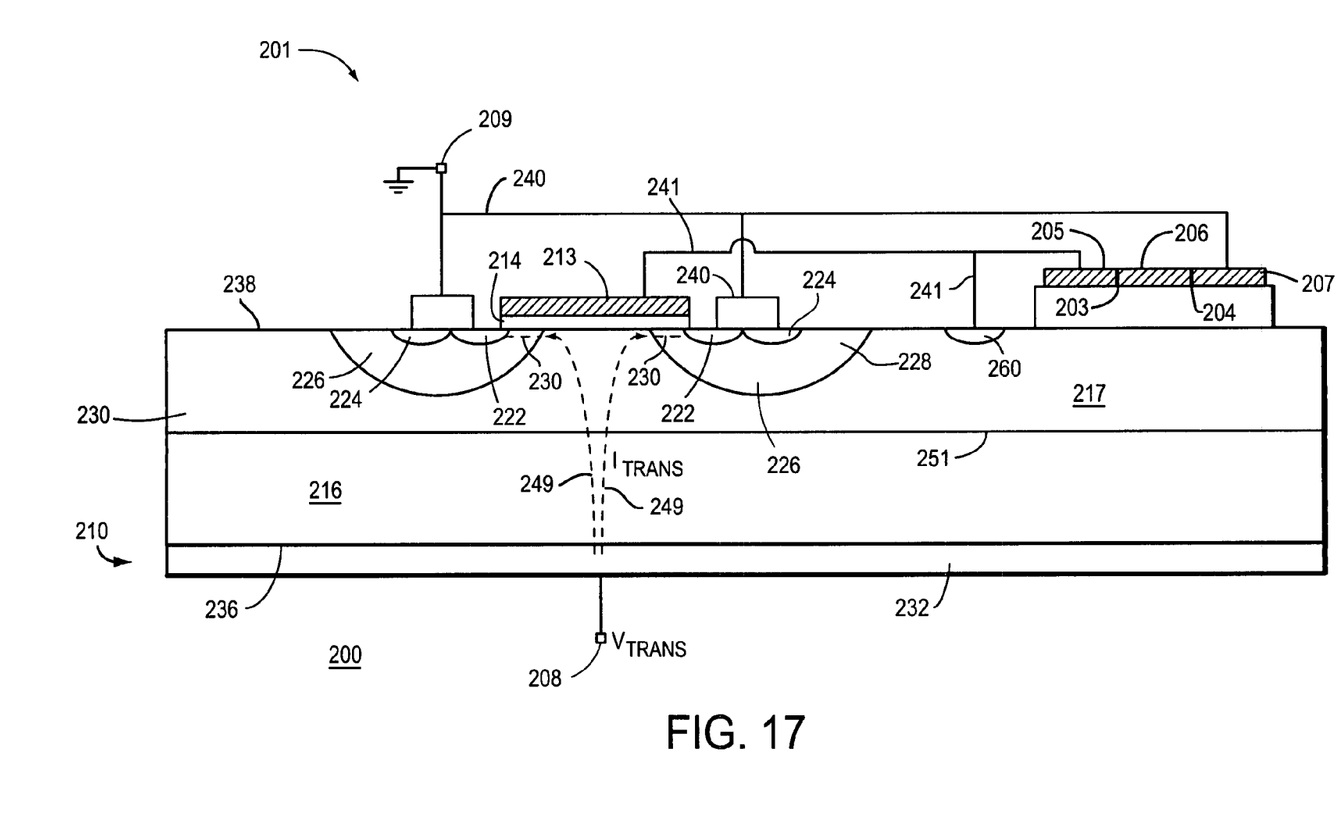
FIG. 17 is a cross-sectional view of an IGBT-based TVS device with an alternate gate biasing arrangement.

FIG. 17 is a cross-sectional view of TVS device 201 in another alternate embodiment. The structure and operation are similar to the embodiments described above, except as follows.

A drift contact region 260 is formed in epitaxial layer 217 to provide an ohmic contact at surface 238. In one embodiment, drift contact region 260 is heavily doped to have an n-type conductivity using the same processing steps as region 222 to operate at substantially the same potential as epitaxial region 217.

Gate terminal 213 is connected through interconnect line 241 to drift contact region 260 to bias gate terminal 213 at the same potential as epitaxial region 217. Hence, gate terminal 213 is biased through forward-biased junction 251, rather than by a direct connection to lead 208. Consequently, in response to transient voltage $V_{TRANS}$, the voltage level on lead 208 is about 0.6 volts higher than what it would be if gate terminal 213 were connected to lead 208 through a bonding wire. Since no bonding wire is needed to bias gate terminal 213, the FIG. 17 embodiment typically has a lower inductance and therefore a faster response and lower cost.

Figure 18:
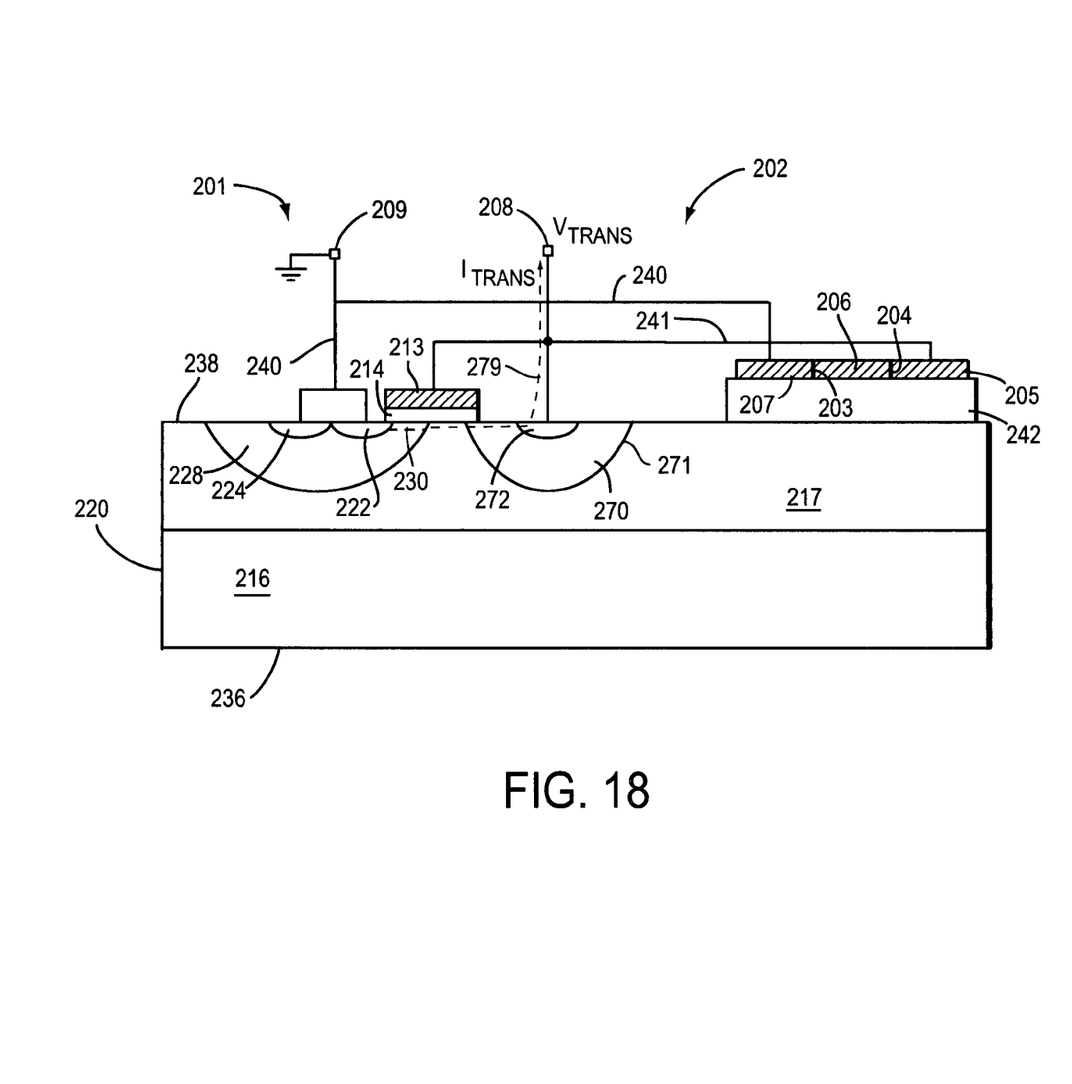
FIG. 18 is a cross-sectional view of the TVS device in a planar embodiment.

FIG. 18 is a cross-sectional view of TVS device 201 in an embodiment as a planar or lateral device. The operation and structure are similar to those described above except as follows.

Sublayer 216 has an n-type conductivity and typically may be heavily doped to provide a ground plane, especially if other circuitry besides TVS device 201 is integrated on substrate 220. Hence, sublayer 216 and epitaxial layer 217 have the same conductivity type.

A p-type collector region 270 is formed in epitaxial layer 217 using the same processing steps as those used to form body region 228. A collector contact region 272 is formed at top surface 238 within collector region 270. Collector contact region is heavily doped to provide a good ohmic contact for operating as a collector terminal of IGBT 202.

A junction 271 is formed between epitaxial layer 217 and collector region 270, both of which are relatively lightly doped and therefore provide a low capacitance load to devices protected by TVS device 201. Gate terminal 213 is connected directly to lead 208 and collector contact region 272 with interconnect line 241 as shown to operate at the same potential as the collector terminal.

When IGBT 202 turns on in response to transient signal $V_{TRANS}$, surge current $I_{TRANS}$ flows from channel 230 laterally, i.e., in a direction parallel to top surface 238, along a current path 279 through collector region 270, collector contact region 272 and interconnect line 241 to lead 208 as shown. Junction 271 forward biases to inject minority carriers into both epitaxial layer 217 and collector region 270, thereby conductivity modulating both regions and producing a low resistance path that enhances the current capability of TVS device 201.

External connections are made through leads 208–209, both of which are formed at top surface 238 and connected with standard wire bond or clip techniques.

In summary, several methods of providing a TVS device using MOS and IGBT structures are presented. The TVS devices exhibit superior leakage current performance, while allowing for clamping voltages in the sub-5 volt range. Clamping voltages between 0.5 volts and 5 volts are readily available through implantation control and high gain allows relatively constant clamping voltage characteristics.

What is claimed is:

1. A semiconductor device for suppressing an external transient voltage, comprising an insulated gate bipolar transistor (IGBT) having a gate terminal and a first conduction terminal coupled to receive the external transient voltage, first and second diodes coupled in a back to back fashion between the gate and first conduction terminals, and a second conduction terminal to shunt a surge current flowing through the first conduction terminal in response to the external transient voltage exceeding a predetermined level.

2. The semiconductor device of claim 1, further comprising a semiconductor substrate having a top surface for forming the first conduction terminal and the gate terminal of the IGBT.

3. The semiconductor device of claim 2, wherein the semiconductor substrate includes:
   a body region of a first conductivity type for inverting to form a channel of the IGBT;
   an emitter region formed at the top surface for receiving the surge current from the first conduction terminal; and
   a drift region having a second conductivity type and coupled to the channel for conducting the surge current.

4. The semiconductor device of claim 3, wherein the semiconductor substrate further includes a collector region of the first conductivity type formed adjacent to the drift region for routing the surge current between the drift region and the second conduction terminal.

5. The semiconductor device of claim 4, wherein the collector region is formed on the top surface of the semiconductor substrate.

6. The semiconductor device of claim 4, wherein the semiconductor substrate has a bottom surface for forming the collector region and the second conduction terminal.

7. The semiconductor device of claim 6, further comprising a semiconductor package having a die flag for mounting the semiconductor substrate, wherein the collector region is electrically coupled to the die flag for routing the surge current to an external node.

8. The semiconductor device of claim 7, wherein the semiconductor package further includes a bonding wire coupled between the gate terminal and the die flag.

9. The semiconductor device of claim 6, further comprising a collection region of the first conductivity type that is coupled to the first conduction terminal and formed at the top surface for collecting minority carriers injected from the collector region.

10. The semiconductor device of claim 3, wherein the first and second diodes are formed in a semiconductor layer disposed on the top surface of the semiconductor substrate.

11. The semiconductor device of claim 10, wherein a region of the semiconductor layer overlies the channel to form the gate terminal of the IGBT.

12. The semiconductor device of claim 10, wherein the semiconductor layer is formed with polycrystalline silicon.

13. The semiconductor device of claim 12, wherein the external transient voltage turns on the IGET to conduct the surge current between the first and second conduction terminals at a level greater than about five amperes.

14. The semiconductor device of claim 13, wherein the IGHT limits a magnitude of the external voltage transient to a value less than about five volts.

15. A semiconductor device for suppressing an external transient voltage, comprising an insulated gate bipolar transistor (IGBT) having a gate terminal and a first conduction terminal coupled to receive the external transient voltage and a second conduction terminal to shunt a surge current flowing through the first conduction terminal in response to the external transient voltage exceeding a predetermined level, wherein the semiconductor device further includes:
  a semiconductor substrate having a top surface for forming the first conduction terminal and the gate terminal of the IGBT and a bottom surface;
  a body region of a first conductivity type formed in the semiconductor substrate for inverting to form a channel of the IGBT;
  an emitter region formed at the top surface for receiving the surge current from the first conduction terminal;
  a drift region having a second conductivity type and coupled to the channel for conducting the surge current;
  a collector region of the first conductivity type formed adjacent to the drift region for routing the surge current between the drift region and the second conduction terminal; and
  a semiconductor package having a die flag for mounting the semiconductor substrate, wherein the collector region is electrically coupled to the die flag for routing the surge current to an external node.

16. The semiconductor device of claim 15 further comprising first and second diodes coupled in a back to back fashion between the gate arid first conduction terminals.

* * * * *